(12) United States Patent
Izumi et al.

(10) Patent No.: US 7,845,284 B2
(45) Date of Patent: Dec. 7, 2010

(54) OVERHEAD TRAVELING VEHICLE HAVING SAFETY MEMBER

(75) Inventors: Takanori Izumi, Inuyama (JP); Eiji Wada, Inuyama (JP)

(73) Assignee: Murata Machinery, Ltd., Kyoto-shi (JP)

( * ) Notice: Subject to any disclaimer, the term of this patent is extended or adjusted under 35 U.S.C. 154(b) by 467 days.

(21) Appl. No.: 11/875,160

(22) Filed: Oct. 19, 2007

(65) Prior Publication Data
US 2008/0092769 A1    Apr. 24, 2008

(30) Foreign Application Priority Data
Oct. 20, 2006    (JP) .............................. 2006-285785

(51) Int. Cl.
*B61J 3/00* (2006.01)
(52) U.S. Cl. .................................. 104/88.02
(58) Field of Classification Search ................. 105/148, 105/149; 104/88.01, 88.02, 89, 90, 118; 235/375, 385
See application file for complete search history.

(56) References Cited

U.S. PATENT DOCUMENTS 7,597,257 B2 * 10/2009 Sone .......................... 235/385

FOREIGN PATENT DOCUMENTS

| JP | 52-051651 | | 4/1977 |
| JP | 2-66366 | U | 5/1990 |
| JP | 06-286603 | A | 10/1994 |
| JP | 2001-213588 | A | 8/2001 |
| JP | 2004-277066 | * | 10/2004 |
| JP | 2004-277066 | A | 10/2004 |

OTHER PUBLICATIONS

Notification of Reasons for Refusal dated Aug. 16, 2008 issued in corresponding Japanese Application No.: 2006-285785.

* cited by examiner

*Primary Examiner*—S. Joseph Morano
*Assistant Examiner*—Robert J McCarry, Jr.
(74) *Attorney, Agent, or Firm*—Westerman, Hattori, Daniels & Adrian, LLP

(57) ABSTRACT

A safety frame is provided to face a lid at a position where an article is held by an overhead traveling vehicle. A lower frame of the safety frame is movable upwardly relative to an upper frame of the safety frame. Further, an optical axis of a photoelectric sensor is provided between the lower frame and the upper frame.

3 Claims, 4 Drawing Sheets

OVERHEAD TRAVELING VEHICLE HAVING SAFETY MEMBER

TECHNICAL FIELD

The present invention relates to an overhead traveling vehicle. In particular, the present invention relates to safety of transported articles.

BACKGROUND ART

The overhead traveling vehicle transports cassettes such as semiconductor cassettes or reticle cassettes in a clean room or the like. A pair of safety covers are provided on front and rear sides of a body of an overhead traveling vehicle in a traveling direction for preventing fall of transported articles such as the cassettes. Further, the overhead traveling vehicle has a safety frame facing a lid of the cassette for preventing fall of the article due to detachment of the lid from the cassette. Further, a photoelectric sensor is provided in the frame to detect detachment of the lid (Japanese Patent Publication No. 2004-277066). For added safety against lid detachment, in the case where a lid has been detached from a cassette, e.g., at a load port, it is necessary to detect detachment of the lid also at the time of elevating the casette by an elevation unit.

DISCLOSURE OF THE INVENTION

Problems to be Solved by the Invention

An object of the present invention is to make it possible to detect lid detachment at the time of elevating a transported article from a load port or the like in the case where the lid has been detached.

Another object of the present invention is to make it possible to easily rotate a lower frame relative to an upper frame at the time of elevating an article in the case where the lid has been detached from the article.

Still another object of the present invention is to reliably detect lid detachment without obstructing lateral feeding of a transported article.

Means for Solving the Problems

According to the present invention, an overhead traveling vehicle traveling along a travel rail comprises an elevation unit for holding a transported article, and elevating and lowering, and a safety member facing a lid of the transported article for preventing fall of the lid. The safety member comprises an upper frame and a lower frame supported by the upper frame in a manner that the lower frame is movable upwardly. Further, the safety member comprises a light emitter or a light receiver of a photoelectric sensor provided in the lower frame.

Preferably, one of an upper left portion and an upper right portion of the lower frame is rotatably supported by the upper frame, the other of the upper left portion and the upper right portion of the lower frame is held by the upper frame, and temporarily fixed. Further, an edge extending downwardly from the temporarily fixed portion to the lower frame is inclined toward a central position of the lower frame in a left-right direction.

Further, preferably, the overhead traveling vehicle further comprises means for laterally moving the elevation unit, and the safety unit is movable laterally together with the elevation unit. A gap formed between the transported article excluding the lid and the lower frame is smaller than a thickness of the lid.

According to another aspect of the present invention, an overhead traveling vehicle traveling along a travel rail comprises an elevation unit for holding a transported article, and elevating and lowering, and in order to prevent fall of a lid of the transported article from the overhead traveling vehicle, a safety unit facing a lid of the transported article is provided. The safety unit comprises an upper frame, and a lower frame supported by the upper frame in a manner that the lower frame is movable upwardly. Further, the safety unit comprises a light emitter or a light receiver of a photoelectric sensor provided in the lower frame. Further, at the time of elevating the elevation unit, if the lid is almost detached from the transported article, and contacts the lower frame, the lower frame and the lid are moved together upwardly to prevent fall of the lid by a force from the lower frame, and the photoelectric sensor detects that the lid is almost detached from the transported article.

When it is detected that the lid is almost detached, for example, elevation of the article is stopped, and an error indicating that the lid is almost detached is notified to a controller or the like on the ground.

Advantages of the Invention

In the present invention, in the case where a lid of a transported article has been detached, or almost detached at a load port or the like, at the time of elevating the transported article by an elevation unit, the lid contacts a lower frame of a safety member. The lower frame is rotatable upwardly, or movable upwardly relative to an upper frame. Therefore, the lid is not pressed downwardly to fall. When the lower frame moves upwardly by the lid, an optical axis of a photoelectric sensor is deviated from a light receiver. In this manner, in the case where a lid is detached, or almost detached from the transported article, at the time of elevating the transported article, it is possible to detect the abnormal state of the lid, and the lid is not pressed to fall. Further, after elevation of the transported article, if the lid of the article is detached during transportation, the optical axis is interrupted. Also at this time, the photoelectric sensor for abnormal detection can be used for detection of lid detachment.

Further, if one of an upper left portion and an upper right portion of the lower frame is rotatably supported by the upper frame, the other of the upper left portion and the upper right of the lower frame portion is held by the upper frame, and temporarily fixed, when the lower frame contacts the lid, the lower frame is rotated easily. Further, if an edge extending downwardly from the temporarily fixed portion to the lower frame being inclined toward a central position of the lower frame in a left-right direction, the edge can easily pass through the portion of the lower frame held by the upper frame.

Further, if a gap formed between the transported article excluding the lid and the lower frame is smaller than a thickness of the lid, in the case where a lid has been detached from the transported article, at the time of elevating the transported article, the lid contacts the lower frame reliably. Further, even if the lid is detached from the article during transportation, the lid does not fall. Further, if the safety member and the elevation unit are provided to move together laterally, it is possible to detect lid detachment during lateral movement.

BRIEF DESCRIPTION OF THE DRAWINGS

FIG. 1 is a front view showing an overhead traveling vehicle and a travel rail according to an embodiment.

FIG. 2 is a side view showing the overhead traveling vehicle and the travel rail according to an embodiment.

FIG. 3 is a horizontal cross sectional view taken along a line III-III in FIG. 1.

FIG. 4 is a partial enlarged front view in an area near a safety pin in the overhead traveling vehicle according to the embodiment.

FIG. 5 is a partial enlarged side view in an area near a lower frame in the overhead traveling vehicle according to the embodiment.

DESCRIPTION OF THE NUMERALS

Figure 1:
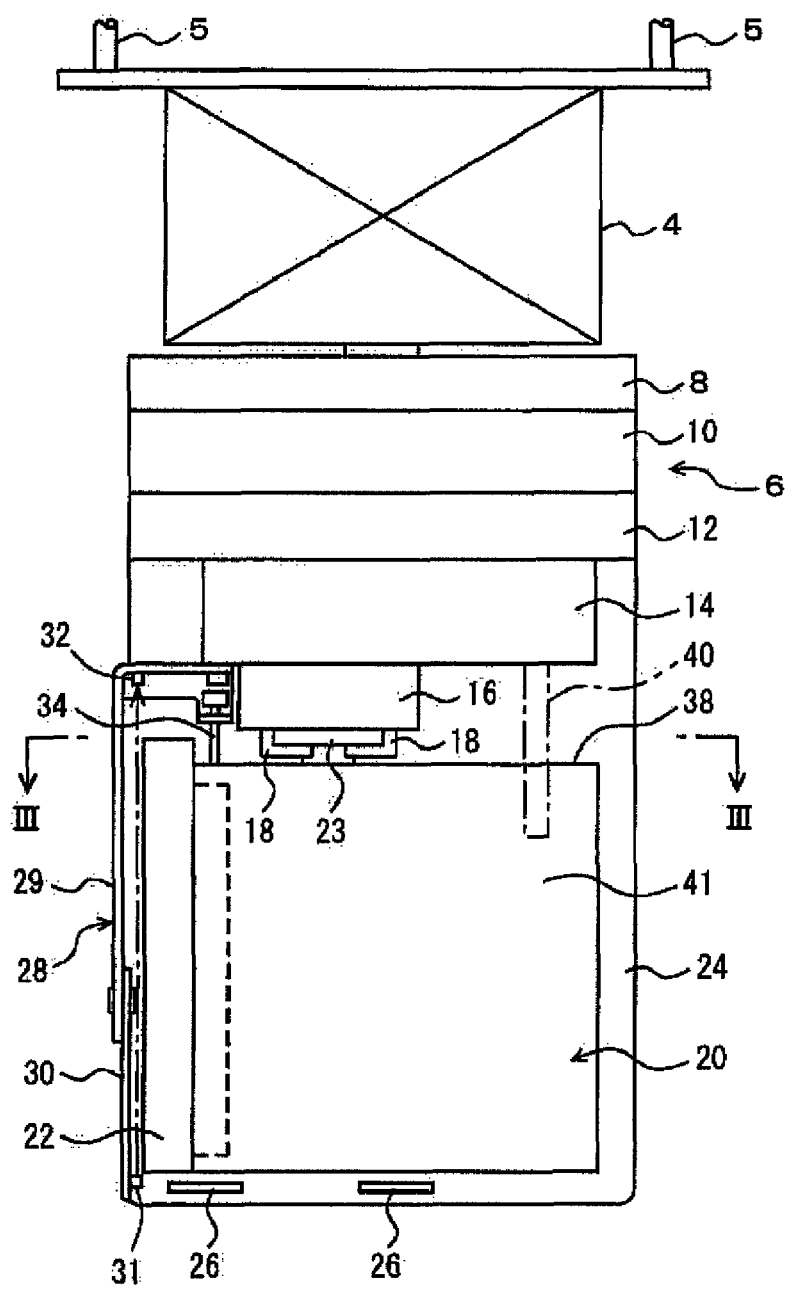
[FIG. 1]
Figure 2:
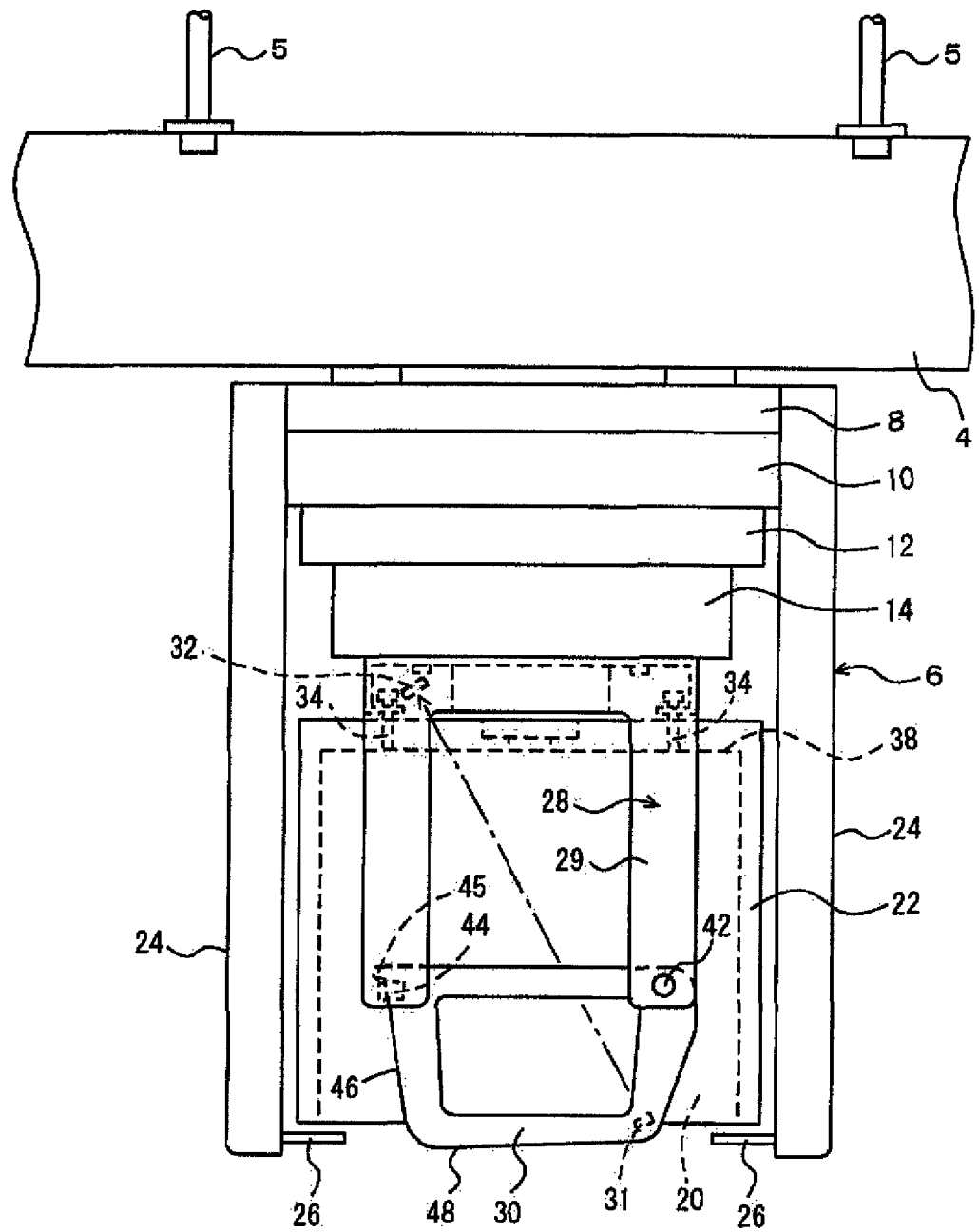
[FIG. 2]
Figure 3:
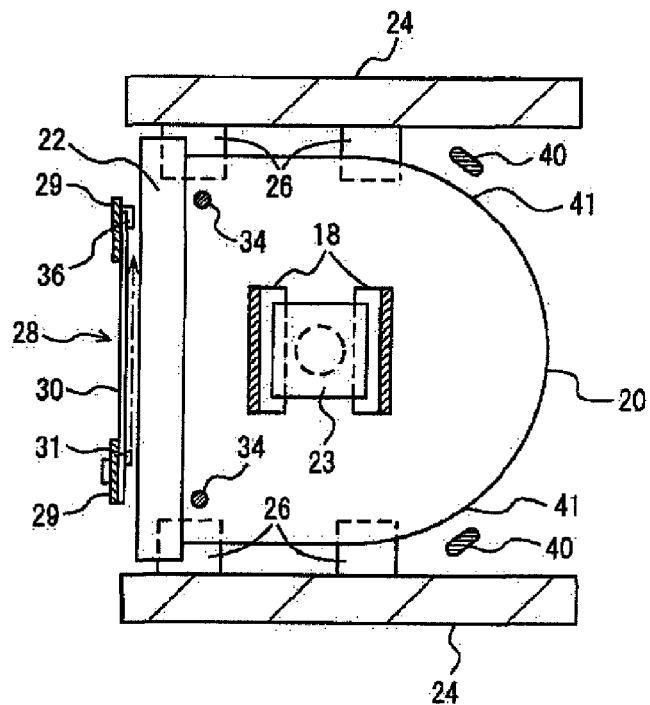
[FIG. 3]

2: overhead traveling vehicle
4: travel rail
5: support column
6: overhead traveling vehicle body
8: base
10: lateral feed unit
12: θ drive
14: elevation drive unit
16: elevation unit
18: chuck
20: cassette
22: lid
23: flange
24: safety cover
26: safety claw
28: safety frame
29: upper frame
30: lower frame
31: light emitter
32: light receiver
34: safety pin
35: head
36: mounting plate
37: through hole
38: cassette upper surface
40: safety member
41: back side portion of cassette
42: pin
44: clamp
45: projection
46: clamp side end
48: frame bottom
d: gap
w: thickness

EMBODIMENTS

FIGS. 1 to 5 show an overhead traveling vehicle 2 according to an embodiment. In the drawings, a reference numeral 4 denotes a travel rail provided, e.g., near a ceiling of a clean room. Reference numerals 5 denote support columns. The overhead traveling vehicle 2 has a travel drive unit (not shown) inside the travel rail. The travel drive unit supports an overhead traveling vehicle body 6 for allowing the overhead traveling vehicle 2 to travel along the travel rail 4. A reference numeral 8 denotes a base of the overhead traveling vehicle body 6, a reference numeral 10 denotes a lateral feed unit, a reference numeral 12 denotes a θ drive, a reference numeral 14 denotes an elevation drive unit, and a reference numeral 16 denotes an elevation unit, e.g., having a pair of chucks 18. The lateral feed unit 10 laterally moves the θ drive 12, the elevation drive unit 14, the elevation unit 16, and the chucks 18 in a direction perpendicular to a traveling direction of the overhead traveling vehicle 2 in a horizontal plane. In the specification, this direction is referred to as the "left-right" direction. The elevation drive unit 14 elevates the elevation unit 16, and the θ drive 12 rotates the elevation drive unit 14 in the horizontal plane. The θ drive 12 may not be provided.

A reference numeral 20 denotes a cassette containing semiconductors, reticles, or the like. The chucks 18 support the bottom of a flange 23 of the cassette 20. A reference numeral 22 denotes a detachable lid provided on one of the left and right of the overhead traveling vehicle 2. A pair of safety covers 24 are provided on the front and rear sides of the base 8 of the overhead traveling vehicle 2 in the traveling direction. Safety claws 26 are provided at the bottom of the base 8. The safety claws 26 are pulled into or pulled out of the safety covers 36 for preventing the cassette 20 from being dropped undesirably.

A safety frame 28 is provided to face the lid 22 of the cassette 20, at a position less than the thickness of the lid 22 away from the lid 22. For example, the prevention frame 28 is attached to the elevation drive unit 14 or the elevation unit 16. The safety frame 28 includes an upper frame 29 and a lower frame 30 which can be rotated or elevated relative to the upper frame 29. A reference 31 denotes a light emitter, and a reference numeral 32 denotes a light receiver. The light emitter 31 and the light receiver 32 form a photoelectric sensor. One of the light emitter 31 and the light receiver 32 is provided in the lower frame 30, and the other of the light emitter 31 and the light receiver 32 is provided in the upper frame 29 or the elevation drive unit 14 in a manner that the optical axis is oriented upwardly. When the lid 22 moves across the optical axis, such movement of the lid 22 is detected. Reference numerals 34 denote safety pins. A reference numeral 35 denotes a head of the safety pin 34. The diameter of the head 35 is larger than that of the lower portion of the safety pin 34. The safety pin 34 passes through a through hole 37 of a mounting plate 36 provided on the upper frame 29. In the structure, the safety pin 34 is vertically movable. The front end of the safety pin 34 contacts an upper surface 38 of the cassette 20. The safety pin 34 is positioned between the back surface of the lid 22 and the flange 23. Specifically, near the back surface of the lid 22, for example, a pair of the safety pins 34 are provided on front and rear sides of the overhead traveling vehicle 2 in the traveling direction.

Instead of the safety pins 34, or together with the safety pins 34, a pair of safety members 40 may be provided on the front and rear sides in the traveling direction, at back side portions 41 of the cassette 20. For example, the safety members 40 have a rod shape, or an arm shape. For example, when the flange 23 is damaged and detached from the chucks 18, and the cassette 20 is rotated in a direction away from the safety frame 28, the safety members 40 contact, and support the back side portions 41 of the cassette 20.

The lower frame 30 is rotatably attached to the upper frame 29, e.g., by a pin 42. At a position opposite to the pin 42 along the traveling direction of the overhead traveling vehicle 2, the lower frame 30 is temporarily fixed by a clamp 44 provided in the upper frame 29. The lower frame 30 has a projection 45 at a position above the clamp 44 for preventing rotation of the lower frame 30 to a direction below the clamp 44. For example, the lower frame 30 has an inverted trapezoidal shape. In particular, an end 46 on the clamp side extending from the clamp 44 is inclined toward the center of the lower frame 30 from the vertical direction such that the width of the lower frame 30 is reduced on the lower side. The lower frame 30 has a frame bottom 48 protruding downwardly, at a position near the clamp 44, and away from the pin 42.

Figure 4:
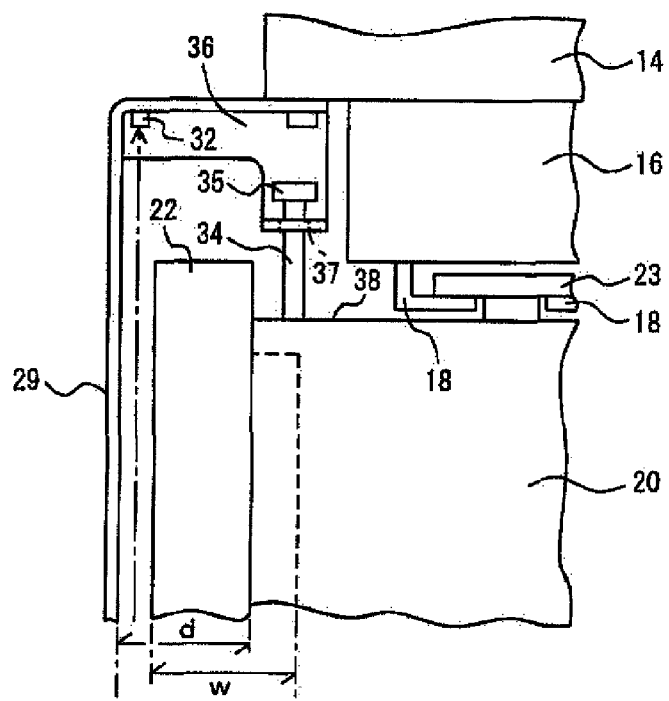
[FIG. 4]
Figure 5:
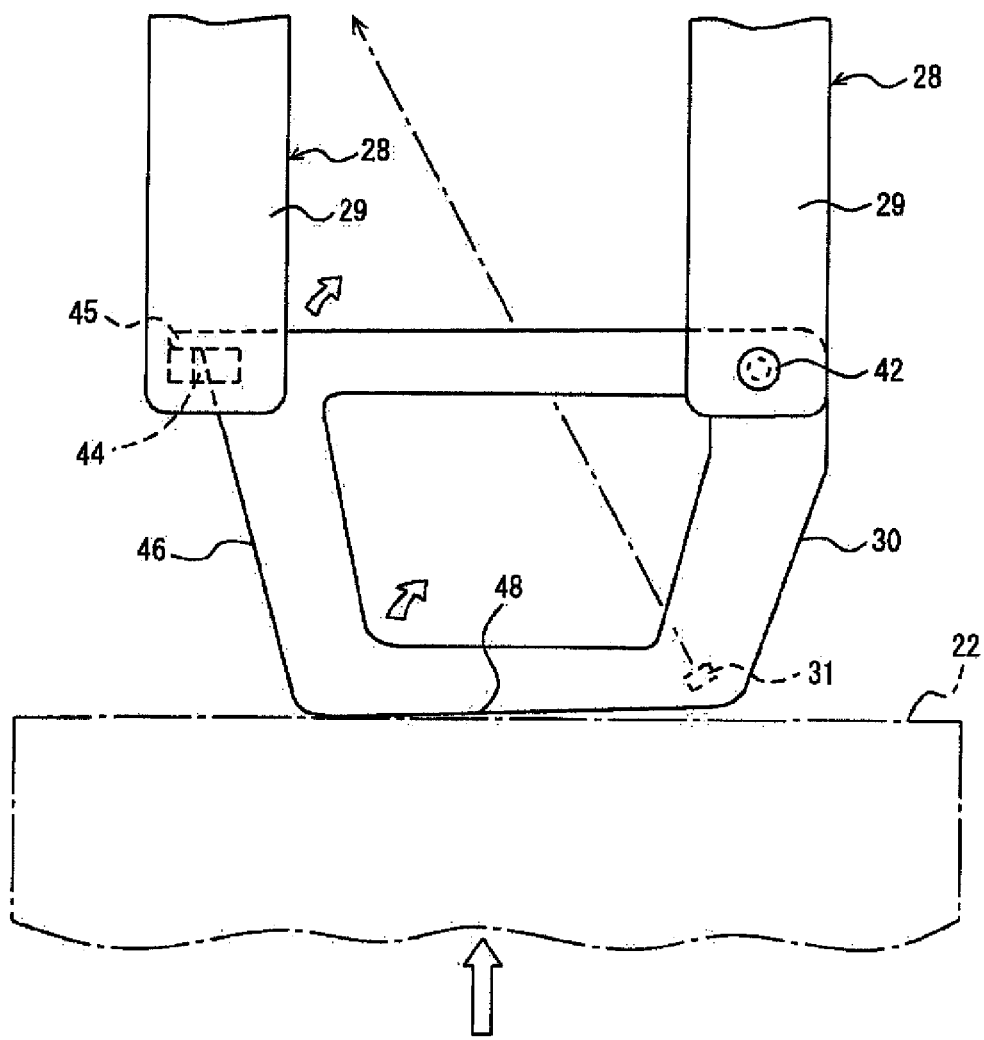
[FIG. 5]

Various structures for attaching the lid 22 to the cassette 20 can be adopted. In the embodiment, it is assumed that the lid 22 is fitted inside the cassette 20. In FIG. 4, the thickness of the lid 22 is denoted by "w", and the smaller of a gap between the cassette 20 and the upper frame 29, and a gap between the cassette 20 and the lower frame 30 is denoted by "d". In the case where the gap "d" is smaller than the thickness "w", the lid 22 does not pass through the gap between the frame 28 and the cassette 20. Therefore, even if the lid 22 is detached from the cassette 20, the lid 22 does not fall.

Operation of the embodiment will be described. The overhead traveling vehicle 2 travels along the travel rail 4. The lateral feed unit 10 moves the elevation drive unit 14 or the like in the left-right direction of the travel rail 4. The elevation drive unit 14 elevates and lowers the elevation unit 16, and the chucks 18 hold the flange 23. When the elevation unit 16 is lowered, the flange 23 of the cassette 20 placed in a load port or the like is chucked. Then, the elevation unit 16 is hoisted. On the load port, the lid 22 may be detached from, or may be almost detached from the cassette 20. In this case, when the cassette 20 is elevated, the lid 22 contacts the frame bottom 48 of the lower frame 30. Thus, the lower frame 30 is pressed upwardly. As a result, the lower frame 30 is detached from the clamp 44, and rotated upwardly about the pin 42.

The projection 45 prevents reverse rotation of the lower frame 30. Further, the end 46 on the clamp side is cut such that the width of the frame 30 becomes small on the lower side. Therefore, the frame 30 can be rotated upwardly, passing through the clamp 44. When the frame 30 is rotated upwardly by the lid 22, the optical axis from the light emitter 31 is deviated from the light receiver 32. Thus, it is possible to detect detachment of the lid 22. In either of the case where the upper portion of the lid 22 is detached from the cassette 20 and the case where the lower portion of the lid 22 is detached from the cassette 20, the lid 22 contacts the lower frame 30, and presses the lower frame 30 upwardly. When detachment of the lid 22 is detected, the overhead traveling vehicle 2 stops traveling. The overhead traveling vehicle 2 reports the abnormal condition to a control unit (not shown), and waits for restoration. Thus, for example, it is possible to prevent damage of the article by movement during transportation due to detachment of the lid 22 from the cassette 20. Even if the lid 22 is suitably attached to the cassette 20 when the article is loaded in the cassette 20, thereafter, the lid 20 may be detached during transportation. In this case, since the detached lid 22 interrupts the optical axis from the light-emitter 31 to the light-receiver 32, it is possible to detect the abnormal condition.

During transportation, due to the damage of the flange 23 of the cassette 20, the flange 23 may be released from the chucks 18. By the safety claws 26, it is possible to prevent the cassette 20 from being dropped downwardly relative to the overhead traveling vehicle. By the safety covers 24, it is possible to prevent the cassette 20 from being dropped on the front side or the rear side of the overhead traveling vehicle in the traveling direction. By the safety frame 28, it is possible to prevent the cassette 20 from being dropped from a side of the lid 22. By the safety pins 34, it is possible to prevent the cassette 20 from being dropped on the left or right side of the overhead traveling vehicle in a direction opposite to the lid 22.

That is, when the cassette 20 is rotated such that the lid 22 side is oriented upwardly and back side portions 41 are oriented downwardly, the lid 22 contacts the safety pin 34 to prevent further rotation. Thus, fall of the cassette 20 is prevented. The height of the cassette upper surface 38 relative to the bottom surface of the flange 23 may vary depending on the product standard of the cassette 20. However, since the safety pin 34 can vertically move inside the through hole 37, the change in the height of the cassette upper surface 38 during transportation can be absorbed. Further, if, e.g., a pair of the safety pins 34 are provided on the front and rear sides of the overhead traveling vehicle in the traveling direction, near the back surface of the lid 22, it is possible to prevent fall of the cassette 20 reliably.

Instead of the safety pins 34, safety members 40 may be provided around the back side portions 41 of the cassette 20 with a spacing. In this manner, when the cassette 20 is rotated such that the back side portions 41 are oriented downwardly, the safety members 40 support the back side portions 41 to prevent fall. When the safety pins 34 and the safety members 40 are compared with each other, the safety pins 34 are smaller than the safety members 40, and can be installed easily. When the safety pins 34 contact the cassette 20, the safety pins 34 move upwardly, and the safety members 40 protrude downwardly in a direction away from the cassette 20. Therefore, both of the safety pins 34 and the safety members 40 do not obstruct elevation movement of the cassette 20. Further, both of the safety pins 34 and the safety members 40 laterally move together with the elevation drive unit 14 by the lateral feed unit 10, and do not obstruct lateral movement.

In the embodiment, when the lid 22 is detached, the lower frame 30 is rotated upwardly. Alternatively, the lower flame 30 may be moved upwardly relative to the upper frame 29 such that the lower frame 30 can be pressed upwardly by the detached lid 22. In this case also, a stopper is provided to prevent the lower frame 30 from being lowered beyond a predetermined position.

In the embodiment, the following advantages can be obtained.

(1) In the case where the lid 22 is detached from, or almost detached from the cassette 20, when the lid 22 is elevated, the lower frame 30 is rotated, and the optical axis from the light emitter 31 is deviated from the light receiver 32. Thus, at the time of elevating the cassette 20, it is possible to detect detachment of the lid 22, and prevent damage of the article in the cassette 20 which could otherwise occur when the cassette 20 having the detached lid is transported.

(2) When the lid 22 is detached during traveling or during lateral feeding, such a state can be detected by interruption of the optical axis between the light emitter 31 and the light receiver 32.

(3) Using the light emitter 31 and the light receiver 32, it is possible to detect detachment of the lid at the time of loading the article, and during traveling.

(4) Since the lower frame is rotated, even if the cassette with a detached lid is loaded, the lid does not fall.

(5) It is possible to prevent fall of the cassette 20 in any of the front, rear, left, right, and vertical directions.

(6) The pins 34 and the safety member 40 do not obstruct elevation and lateral feeding of the cassette 20.

(7) It is possible to provide the safety pin 34 easily, and even if the height of the cassette upper surface 38 changes, the change can be absorbed by vertical movement of the pin 34 in the through hole 37.

The invention claimed is:

1. An overhead traveling vehicle traveling along a travel rail, comprising:
   an elevation unit for holding a transported article and elevating and lowering the transported article; and
   a safety member facing a lid of the transported article for preventing fall of the lid, the safety member including:
   an upper frame;

a lower frame supported by the upper frame and being movable upwardly; and a light emitter or a light receiver of a photoelectric sensor provided on the lower frame, wherein a coupled end of said photoelectric sensor is provided on the upper frame or the elevation unit, wherein one of an upper left portion and an upper right portion of the lower frame is rotatably supported by the upper frame, the other of the upper left portion and the upper right portion is held by the upper frame and temporarily fixed, and an edge extending downwardly from the temporarily fixed portion to the lower frame is inclined toward a central position of the lower frame in a left-right direction.

2. The overhead traveling vehicle according to claim 1, further comprising means for laterally moving the elevation unit, wherein the safety member is movable laterally together with the elevation unit, and wherein a gap formed between the transported article excluding the lid and the lower frame is smaller than a thickness of the lid.

3. A method of preventing fall of a lid of a transported article from an overhead traveling vehicle traveling along a travel rail, the method comprising:

providing a safety unit facing the lid of a transported article, the safety unit including:

an upper frame;

a lower frame supported by the upper frame and being movable upwardly; and a light emitter or a light receiver of a photoelectric sensor provided on the lower frame, wherein a coupled end of said photoelectric sensor is provided on the upper frame or the elevation unit, the lower frame being movable together with the lid upwardly to prevent fall of the lid by a force from the lower frame at the time of elevating the elevation unit, if the lid is detached from the transported article and is contacting the lower frame; and detecting the lid being detached from the transported article, using the photoelectric sensor, wherein the overhead traveling vehicle comprises an elevation unit for holding the transported article and elevating and lowering the transported article, and wherein one of an upper left portion and an upper right portion of the lower frame is rotatably supported by the upper frame, the other of the upper left portion and the upper right portion is held by the upper frame and temporarily fixed, and an edge extending downwardly from the temporarily fixed portion to the lower frame is inclined toward a central position of the lower frame in a left-right direction.

* * * * *